(12) United States Patent
Dedieu et al.

(10) Patent No.: US 7,869,555 B2
(45) Date of Patent: Jan. 11, 2011

(54) DIGITAL WORD REPRESENTATIVE OF A NON-INTEGER RATIO BETWEEN THE RESPECTIVE PERIODS OF TWO SIGNALS

(75) Inventors: Sébastien Dedieu, Crolles (FR); Jerome LaJoinie, Gieres (FR); Marc Houdebine, Meylan (FR)

(73) Assignee: STMicroelectronics SA, Montrouge (FR)

( * ) Notice: Subject to any disclaimer, the term of this patent is extended or adjusted under 35 U.S.C. 154(b) by 734 days.

(21) Appl. No.: 11/891,773

(22) Filed: Aug. 13, 2007

(65) Prior Publication Data

US 2008/0043894 A1 Feb. 21, 2008

(30) Foreign Application Priority Data

Aug. 21, 2006 (FR) .................................. 06 07416

(51) Int. Cl.
*H03D 3/24* (2006.01)
(52) U.S. Cl. ...................................................... 375/376
(58) Field of Classification Search ................. 375/215, 375/294, 327, 376; 342/103; 370/503; 455/180.3, 455/266; 327/141, 146, 147, 148, 149, 150, 327/156, 157, 158, 159
See application file for complete search history.

(56) References Cited

U.S. PATENT DOCUMENTS

| | | | |
|---|---|---|---|
| 6,094,101 | A | 7/2000 | Sander et al. |
| 6,326,851 | B1 | 12/2001 | Staszewski et al. |
| 6,429,693 | B1 * | 8/2002 | Staszewski et al. ........... 327/12 |
| 2002/0158696 | A1 | 10/2002 | Staszewski et al. |
| 2003/0133522 | A1 * | 7/2003 | Staszewski et al. ......... 375/345 |
| 2004/0232947 | A1 | 11/2004 | Temporiti Milani et al. |

FOREIGN PATENT DOCUMENTS

EP 1 178 609 A2 2/2002

* cited by examiner

*Primary Examiner*—Sam K Ahn

(57) ABSTRACT

A phase-locked loop circuit having a comparator that receives a target digital word representative of a non-integer target ratio between a main signal and a reference signal having a reference frequency. The circuit also includes digitally-controlled oscillator coupled to the comparator to deliver an output signal. One return loop is coupled between the output of the oscillator and the comparator. The latter includes a device to generate a digital word representing the non-integer ratio between the period of the reference signal and the period of the output signal, the reference signal and the output signal respectively corresponding to the first and second signal, and the fixed integer part N being equal to the integer part of the target non-integer ratio. The comparator compares the digital word and target digital word. The oscillator adjusts the frequency of the output signal as a function of the result delivered by the comparator.

20 Claims, 15 Drawing Sheets

DIGITAL WORD REPRESENTATIVE OF A NON-INTEGER RATIO BETWEEN THE RESPECTIVE PERIODS OF TWO SIGNALS

CROSS-REFERENCE TO RELATED APPLICATIONS

The present application is related to French Patent Application No. 06/07416, filed Aug. 21, 2006, entitled "METHOD FOR GENERATING A DIGITAL WORD REPRESENTATIVE OF A NON-INTEGER RATIO BETWEEN THE RESPECTIVE PERIODS OF TWO SIGNALS, AND CORRESPONDING DEVICE". French Patent Application No. 06/07416 is assigned to the assignee of the present application and is hereby incorporated by reference into the present disclosure as if fully set forth herein. The present application hereby claims priority under 35 U.S.C. §119(a) to French Patent Application No. 06/07416.

TECHNICAL FIELD

The present disclosure generally relates to the determination of a non-integer ratio between a first signal and a second signal.

BACKGROUND

The determination of a non-integer ratio between two signals poses a problem in conventional systems. Currently, it is not possible to precisely compare the phase existing between the edges of the two signals whose ratio it is desired to determine, owing to the fractional part of the ratio.

U.S. Pat. No. 6,094,101, entitled "Direct Digital Frequency Synthesis Enabling Spur Elimination", proposes the direct determination of the non-integer ratio, by means of a special reference signal, in that it requires a prior frequency synthesis even before seeking to determine the non-integer ratio. This synthesis, however, involves several additional components, and is therefore costly in terms of surface area and in terms of power consumption.

Texas Instruments, in the article "Digital Phase-Domain PLL Frequency Synthesizer" and in U.S. Pat. No. 6,326,851, has devised a method that includes over-sampling signals whose frequency is not fixed. The method also includes the direct calculation of the non-integer ratio from each phase-shift (owing to the fractional part) between the edges of the over-sampled signal and the edges of the signal whose frequency is fixed. This method, however, does not allow the fractional and integer parts of the ratio being determined to be obtained in a simple and low-cost manner in terms of power consumption and surface area. As a result, it is not really compatible with methods for digital processing of the fractional part, with a view for example to refining its value or to eliminating any possible noise on the signal.

This is therefore a need for systems and methods for determining a non-integer ratio between a first signal and a second signal.

SUMMARY

The present disclosure generally provides systems and methods for determining a non-integer ratio between a first signal and a second signal.

In one embodiment, the present disclosure provides a method of generating a digital word representative of the non-integer ratio between a period of a first signal (Fref) and a period of a second signal (Fout). The method includes determining an integer part of the ratio. The method also includes calculating a fractional part of the ratio. In addition, the method could also include generating the digital word using the determined integer part and the calculated fractional part.

In another embodiment, the present disclosure provide a device for generating a digital word representative of the non-integer ratio between the period of a first signal and the period of a second signal. The device includes a determination circuit to determine the integer part of the ratio. The device could also include a calculation circuit to calculate the fractional part of the ratio. The calculation circuit is coupled with an output of the determination circuit. The device could also include a generation circuit to generate the digital word from the determined integer part and from the calculated fractional part.

In still another embodiment, the present disclosure provides a phase-locked loop circuit. The phase-locked loop circuit could include a comparator receiving at its input a target digital word representative of a target non-integer ratio between a main signal and a reference signal having a reference frequency. The phase-locked loop circuit could also include a digitally-controlled oscillator coupled to the comparator and capable of delivering an output signal. The phase-locked loop circuit could further include at least one return loop coupled between the output of the oscillator and the comparator. The return loop includes a device capable of generating a digital word representative of the non-integer ratio between the period of the reference signal and the period of the output signal, the reference signal and the output signal respectively corresponding to the first and second signal, and the fixed integer part N being equal to the integer part of the target non-integer ratio.

The comparator is capable of comparing the digital word and target digital word, that the oscillator is capable of adjusting the frequency of the output signal as a function of the result delivered by the comparator. The circuit includes a control circuit capable of controlling the operation of the phase-locked loop at least as long as the fractional part of the non-integer ratio does not belong to a range of values.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
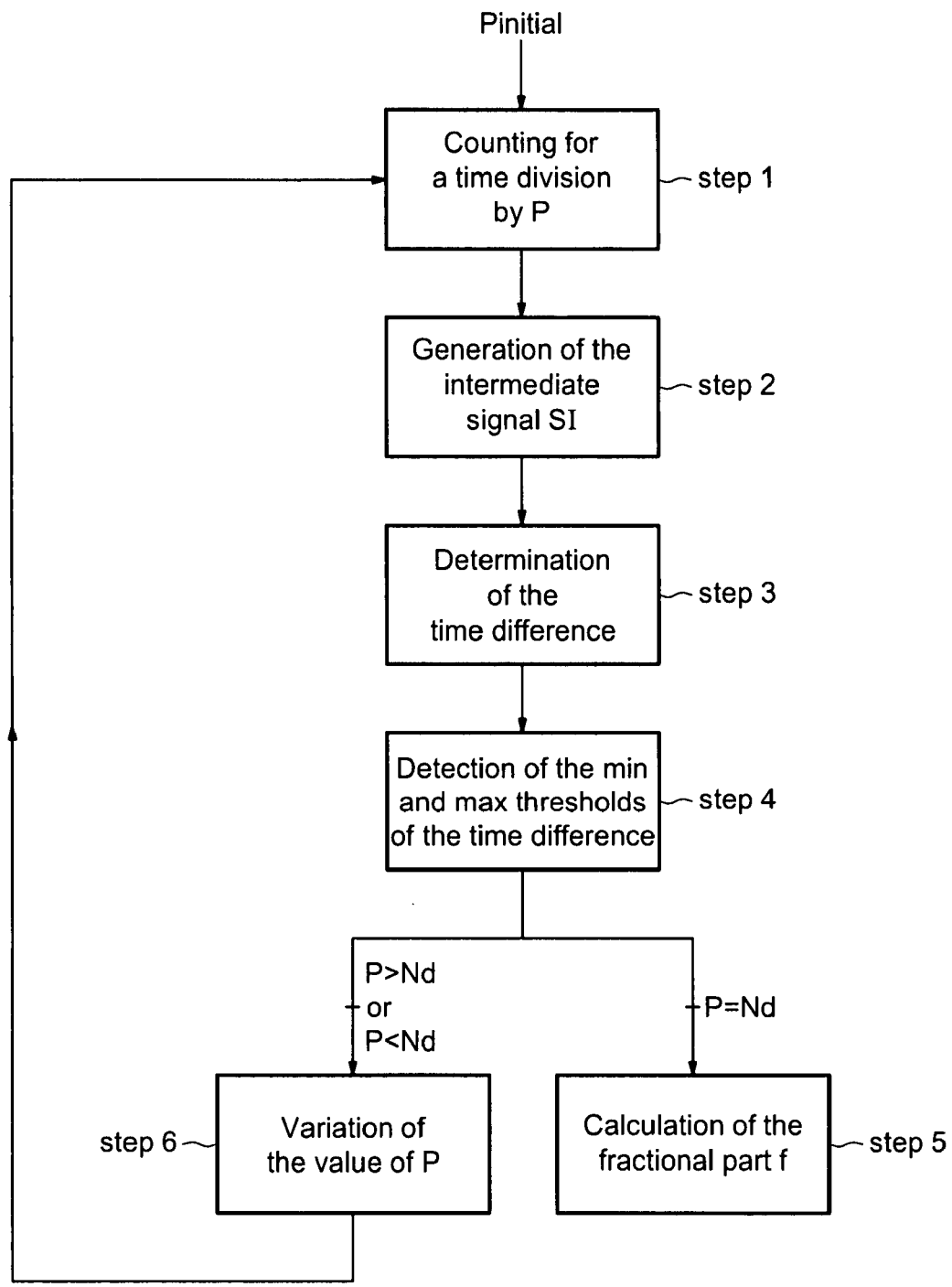
FIG. 1 describes, in a very general manner, one embodiment according to the present disclosure.

FIG. 1 generally describes method 100 according to one embodiment of the present disclosure. Method 100 determines a non-integer ratio between a reference signal (Fref) with a known frequency and another signal (Fout). The integer part (Nd) of the ratio to be determined is unknown in this example.

During a first step (step 105), a value (P) is chosen for a divider integer, reset to the value, Pinitial (for example, the median value of the complete set of values that can be taken by the divider integer (P) for a given application). One goal of method 100 is to progressively adjust the value of the divider integer (P) such that it reaches the value (Nd) of the integer part of the ratio to be determined. For this purpose, P edges of the signal Fout are counted so as to effect a time division by the divider integer (P).

Method 100 continues with step 110, where an intermediate signal (SI) is generated from the divided signal (Fout) that is representative of the time difference between the reference signal (Fref) and the divided signal (Fout). Thus, once the value of the divider integer (P) has reached the value of the integer part of the ratio to be determined, the signal (SI) allows the fractional part (f) to be determined. One objective of the present disclosure is therefore to firstly determine the integer part (Nd), so as to deduce, from the intermediate signal (SI), the fractional part (f).

The time difference between the intermediate signal (SI) and the reference signal (Fref) is then determined in step 115. Then, it is detected whether the time difference may or may not have reached limiting thresholds, minimum or maximum respectively, indicating that the value of the divider integer (P) is lower or higher than the value of the integer part sought in step 120. For example, these limiting thresholds can be thresholds associated with a possible saturation of the time difference, or else thresholds lower than these saturation thresholds. Hereinafter, reference will be made to the saturation of the time difference, although the example shown in FIG. 1 is absolutely not limiting with regard to the chosen thresholds.

Method 100 continues in step 125 where the value of the divider integer (P) is adjusted as a function of the direction of the saturation. Steps 105 to 125 are reiterated for as long as saturation is detected. Once the value of the divider integer (P) has reached that of the integer part (Nd), the value of the fractional part (f) is determined from the time difference in step 130. It should be understood that method 100 could be implemented by software.

Figure 2:
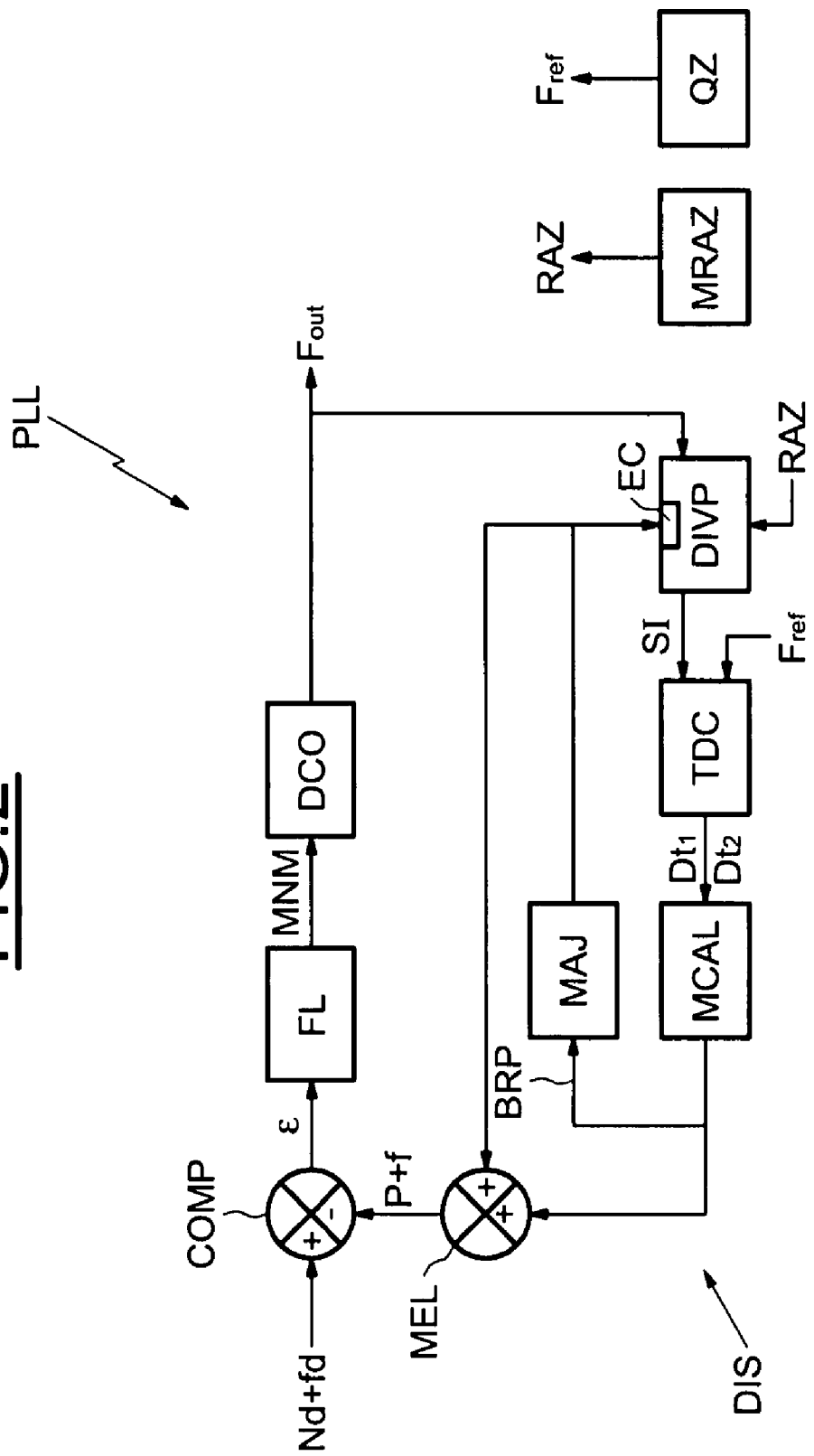
FIG. 2 illustrates one embodiment of the present disclosure.

FIG. 2 generally illustrates a phase-locked loop (PLL) circuit 200 having a device (DIS) 202 for generating a digital word representative of a non-integer ratio between the respective periods of the two signals, Fout and Fref, according to one embodiment of the present disclosure.

In this example, device (DIS) 202 is integrated within a phase-locked loop (PLL) circuit 200 and, more particularly, into the return loop of phase-locked loop (PLL) circuit 200. The return loop is of the digital type and allows, thanks to a negative feedback and once the ratio has been determined, the value of the ratio to be feedback controlled. More generally, device (DIS) 202 may be used without negative feedback, for simply determining the value of the ratio between the respective periods of the two signals, Fout and Fref.

In FIG. 2, the signal Fref is the reference signal (i.e., the first signal) and has a known frequency. This signal can be delivered by a quartz-crystal oscillator (QZ). The signal Fout (i.e., the second signal), delivered to the input of the device (DIS) 202, is periodic according to a period, Tout.

Period, Tout, forms an unknown non-integer ratio (Nd+fd) with the period of the reference signal (Fref), where Nd is the integer part of the ratio and fd is the fractional part of the ratio. The frequency of the output signal, Fout, belongs to a chosen range of frequencies. More precisely, the signal Fout is delivered to a counter/divider (DIVP) 206 which divides the period of the signal Fout by a divider integer (P). The latter is activated by a reset-to-zero signal RAZ, delivered by reset-to-zero means (MRAZ) 208. In other words, the counter/divider DIVP operates when RAZ="1", and is deactivated when RAZ="0".

The divider (DIVP) 206 generates an intermediate signal (SI) from the divided signal (Fout). The intermediate signal (SI) and the reference signal (Fref) are delivered to measurement means (TDC) 210. Measurement means (TDC) 210 measures two values ($Dt_1$ and $Dt_2$,) that are representative of the time difference between the intermediate signal (SI) and the reference signal (Fref) and which will be described in more detail later herein.

Calculation means (MCAL) 212 calculates the time difference from the two values ($Dt_1$ and $Dt_2$). Adjustment means (MAJ) 214 detects a possible saturation of the value of this difference. In the case of saturation, the adjustment means (MAJ) 214 adjusts, in a suitable fashion, the value of the divider integer (P), in such a manner as to reach the value of the integer part, N. For example, if the time difference is representative of a fractional part value much greater than 1, it is then clear that the value of the divider integer (P) is less than Nd. Thus, the adjustment means (MAJ) 214 will therefore increment the divider integer (P).

Adjustment means (MAJ) 214 is inserted into a feedback loop (BRP), connected between the output of the calculation means (MCAL) 212 and a control input (EC) 215 of the counter/divider (DIVP) 206, in such a manner as to adjust the value of P. In the absence of saturation, the calculation means (MCAL) 212 calculates the fractional part from the time difference. The action of the adjustment means (MAJ) 214 on the value of the divider integer (P) is then without effect. As a variant, it is possible to disconnect the negative feedback loop (BRP) from the output of calculation means (MCAL) 212.

The ratio value determined by the device (DIS) 202 is then generated by generation means (MEL) 216 (e.g., a binary adder) and is capable of summing the values of P and of f. This determined value, P+f, is then delivered to a comparator (COMP) 218 that compares it with a ratio value, Nd+fd, to which it is feedback controlled. The phase-locked loop (PLL) circuit 200 is then said to be locked.

Conventionally, the comparator (COMP) 218 determines the error ($\epsilon$) between the values Nd+fd and P+d. This error ($\epsilon$) is filtered by a filter (FL) 220 which delivers a digital word (MNM) to an oscillator (DCO) 222 that is digitally controlled by this digital word (MNM). The filter (FL) 220 performs, for example, a filtering of the proportional-integral-derivative ('PID') type. The oscillator (DCO) 222 delivers the analogue signal Fout (or second signal) at its output, towards the device (DIS) 202. Digitally-controlled oscillators controlled by a digital word are known to those skilled in the art. The frequency of the signal, Fout, depends on the value of the digital word (MNM).

Thus, as soon as the integer part (P) and fractional part (f) of the ratio between the respective periods of the signals, Fref and Fout, are different from the values of Nd and fd, the error ($\epsilon$) allows the oscillator (DCO) 222 to be controlled so that it adjusts the frequency of the signal, Fout, in order to re-establish the equality. In other words, a non-zero value of $\epsilon$ allows the adjustment and the calculation of the ratio effected by the phase-locked loop (PLL) circuit 200 to be repeated (i.e., a digital control means for the iterations of the phase-locked loop).

Figure 3:
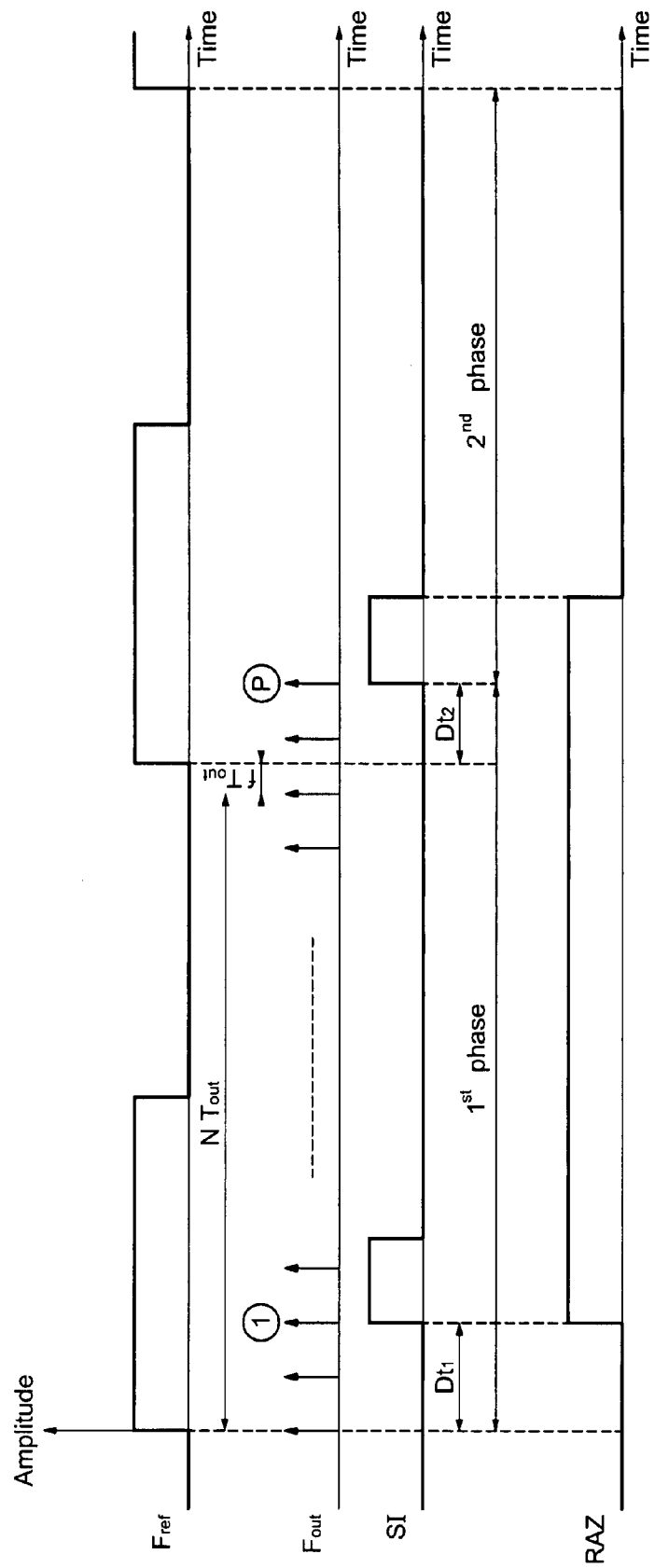
FIGS. 3 to 5 show timing diagrams of the signals implemented by the present disclosure.

FIG. 3 shows plot 300 illustrating the variation of the signals implemented by the device (DIS) 202 over time. The first horizontal axis in FIG. 3 shows two periods of the reference signal (Fref) 302. Each period (Tref) of the reference signal (Fref) 302 is equal to (N+f)*Tout.

The second horizontal axis 304 in FIG. 3 shows the edges of the signal Fout whose period has been divided by the divider integer (P). Counting of the edges of the divided signal, Fout, is carried out. In plot 300, the first edge counted is referenced 306, and the $P^{th}$ counted edge is referenced 308. Simultaneously with the first edge counted, a first edge of the intermediate signal (SI) 310 is generated. In this example, at the first edge counted of the second signal (Fout) 304, the intermediate signal goes from the value "0" to the value "1", then returns to the value "0" after a predetermined lapse of time. Similarly, at the $P^{th}$ counted edge of the second signal (Fout) 304, a second edge of the intermediate signal (SI) 310 is generated. Consequently, the two edges of the intermediate signal (SI) 310 are spaced out by P*Tout.

As a variant, at the $1^{st}$ counted edge, the intermediate signal (SI) 310 could go from "0" to "1", then return to "0" at the $P^{th}$ counted edge. The first edge of the intermediate signal (SI) 310 would then be a rising edge, and the second edge a falling edge.

Starting from the reference signal (Fref) 302 and from the intermediate signal (SI) 310, auxiliary time differences, $Dt_1$ and $Dt_2$, are measured. It should be understood that although FIG. 2 relates to two time differences, device (DIS) 202 could process a succession of time differences ($Dt_i$). The first time difference ($Dt_1$) corresponds to the difference between the first edge of the intermediate signal (SI) 310 and a reference edge, which in this example is the rising edge at the beginning of the first period (relating to FIG. 2) of the signal (Fref) 302.

The second auxiliary time difference, referenced as "$Dt_2$", corresponds to the difference existing between the second edge of the intermediate signal (SI) 310 and the end of the first period of the first signal (Fref) 302.

In the course of this phase for measurement of the differences $Dt_1$ and $Dt_2$ (first phase), the reset-to-zero signal RAZ (additional signal) 312 takes the value "1" between the first edge of the intermediate signal (SI) 310 and the end of the pulse period following the second edge of the intermediate signal (SI) 310. The signal, RAZ 312, subsequently takes the value "0" (second phase) (cf. fourth horizontal axis 312 in FIG. 3), allowing the various calculations for the determination of the fractional part (f) to be performed as described later herein.

Figure 4:
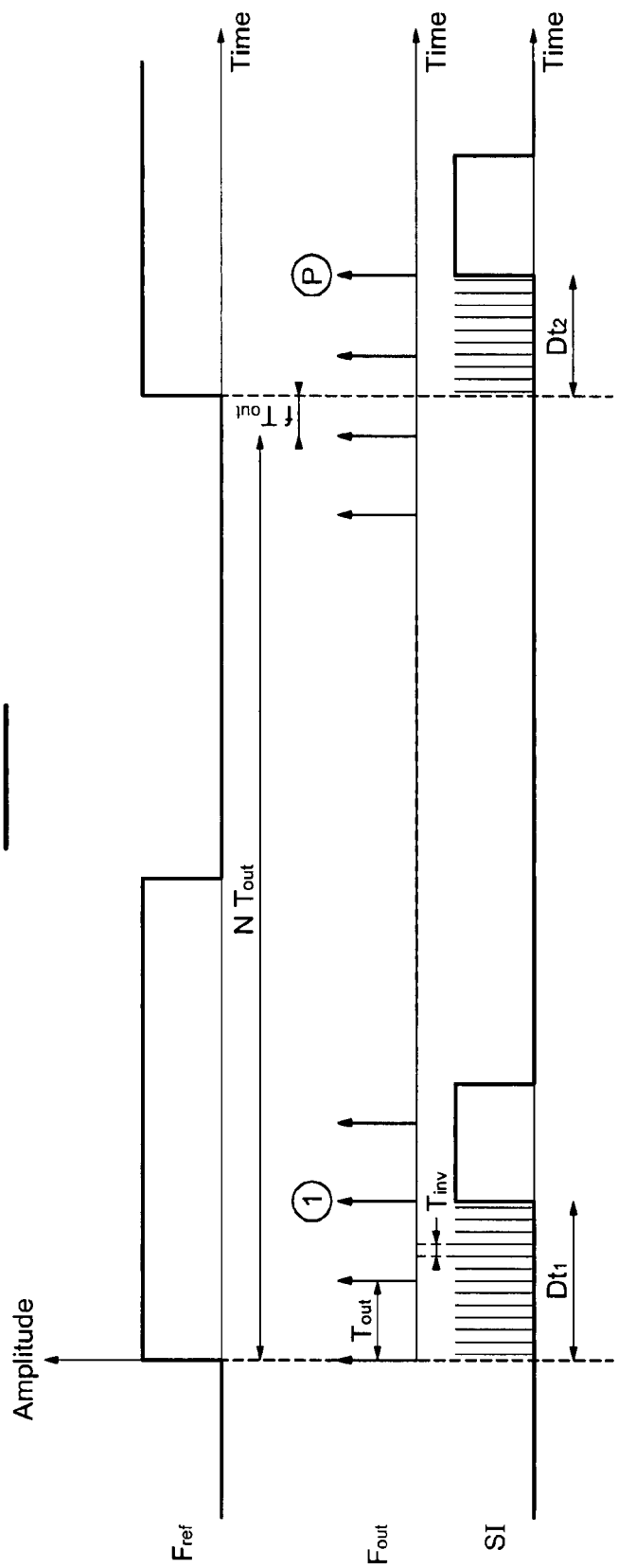

In order to evaluate the differences ($Dt_1$ and $Dt_2$) the differences are digitized by sampling $Dt_1$ and $Dt_2$ according to a fixed sampling step ($T_{inv}$) as shown in plot 400 in FIG. 4. The sampling is preferably carried out by means of a chain of inverters. Accordingly, the relationship is exemplified by Equations 1 and 2 below.

$$N_1 = Ent(Dt_1/T_{inv}) \quad \text{(Eqn. 1)}$$

$$N_2 = Ent(Dt_2/T_{inv}) \quad \text{(Eqn. 2)}$$

In Equations 1 and 2, $N_1$ is a first integer and $N_2$ is a second integer. As shown previously, the relationship between the first signal (Fref) 302 and the second signal (Fout) 304 can exemplified by the relationship shown in Equation 3 below.

$$Tref = (N+f)Tout \quad \text{(Eqn. 3)}$$

In the example shown in FIG. 3, the first edge counted of the second signal (Fout) 304 corresponds to the second edge emitted after the reference edge of the reference signal (Fref) 302. Consequently, if it is assumed that the value taken by the integer (P) is effectively equal to the value of the integer part (N) of the ratio to be determined (as illustrated in FIG. 3), then the relationship exemplified by Equation 4 below could result.

$$Dt_1 - Dt_2 = 2Tout - [Tout + (1-f)Tout] = fTout \quad \text{(Eqn. 4)}$$

In other words, as a function of the sampling step $T_{inv}$, the relationship exemplified by Equation 5 below results.

$$N_1 - N_2 = \frac{Dt_1}{T_{inv}} - \frac{Dt_2}{T_{inv}} = f \frac{T_{out}}{T_{inv}}. \quad \text{(Eqn. 5)}$$

Thus, by performing the difference between the two quantities, $Dt_1$ and $Dt_2$, it is possible to know the value of f*Tout. On the other hand, if the value of the divider integer (P) is greater than that of the integer part to be determined, the difference between $Dt_1$ and $Dt_2$ will be greater than Tout. In other words, the relationship exemplified by Equation 6 below results.

$$Dt_1 - Dt_2 = \alpha Tout \quad \text{(Eqn. 6)}$$

In Equation 6, $\alpha$Tout is a time difference representative of a fractional part greater than 1, which is not possible. If the value of the divider integer (P) is less than that of the integer part to be determined, $Dt_2$ will be negative in relative value. In other words, $Dt_1 - Dt_2 = \beta$ Tout, where $\beta$ is negative. Consequently, as long as the difference, $Dt_1 - Dt_2$, is equal to these limiting values, minimum or maximum (for example, the saturation values), the value of P is adjusted in consequence. The absence of saturation means that the value of P corresponds to that of the integer part (N) sought: the difference ($Dt_1 - Dt_2$) is then representative of the fractional part sought (i.e., the fractional part (f)).

The calculated value of the fractional part (f) is very precise since the determination of the difference ($Dt_1 - Dt_2$) allows any possible noise delay to be eliminated. It should be noted that two limiting cases can occur during the determination of the differences ($Dt_1$ and $Dt_2$). These two cases are generally illustrated in plot 500 shown in FIG. 5.

Figure 5:
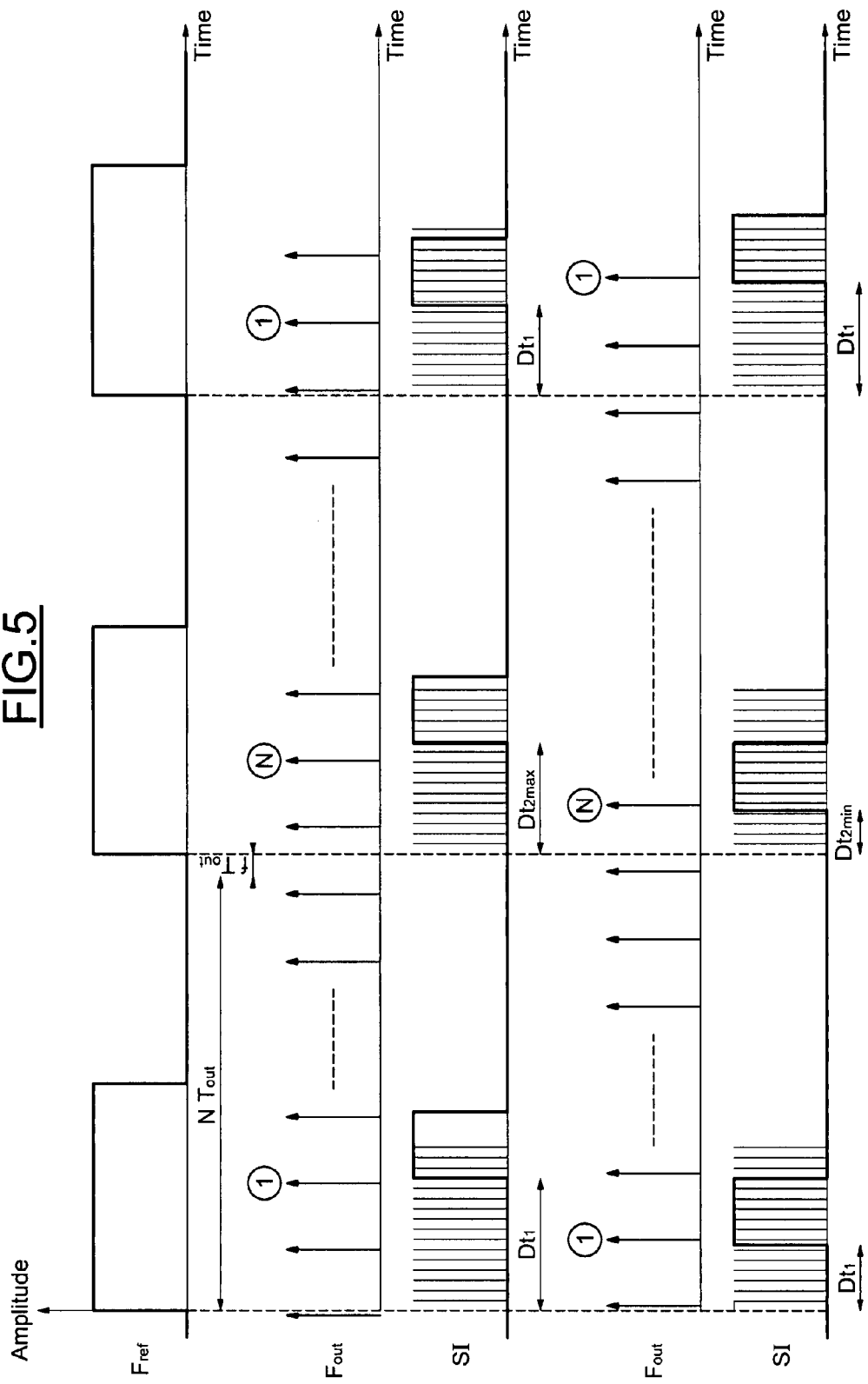

The second horizontal axis 502 in FIG. 5 shows the edges of the intermediate signal (SI) 504 as a function of the edges of the divided signal (Fout) 502. This curve represents the case where the time difference ($Dt_1$) takes its maximum value and corresponds to the generation of an edge of the signal (Fout) 502 just before the reference edge of the reference signal (Fref) 302. In other words, this corresponds to a time shorter than the sampling step, $T_{inv}$. In this case, the maximum difference is carried over onto $Dt_2$. It must then be ensured that the number of inverters in the inverter chain carrying out the sampling be sufficient for sampling $Dt_{1max}$ and the corresponding difference, $Dt_2$.

The third horizontal axis in FIG. 5 shows the edges of the intermediate signal (SI) 504, in the case where the quantity $Dt_1$ takes its minimum value, $Dt_{1min}$. This corresponds to the generation of an edge of the signal (Fout) 502 just after the reference edge of the reference signal (Fref) 302, in other words a lapse of time shorter than the sampling step ($T_{inv}$) after the reference edge. This minimum value is then carried over onto $Dt_2$. If the first edge counted were the first edge emitted, the $N^{th}$ counted (in other words the edge preceding the edge N 503 on the third horizontal axis in FIG. 5) cannot be sampled.

Thus, in one embodiment, by choosing the second edge rather than the $i^{th}$ edge (i>2), the number of components required for the sampling of $Dt_2$ and $Dt_1$ (since $Dt_1 < Dt_{1max}$) is limited, and the values of $Dt_2$ and $Dt_1$ are guaranteed to be sufficiently large (since $Dt_1 > Dt_{1min}$) in order to perform the sampling. However, it is possible to count starting from the $i^{th}$ edge because the sampling means are longer.

Figure 6:
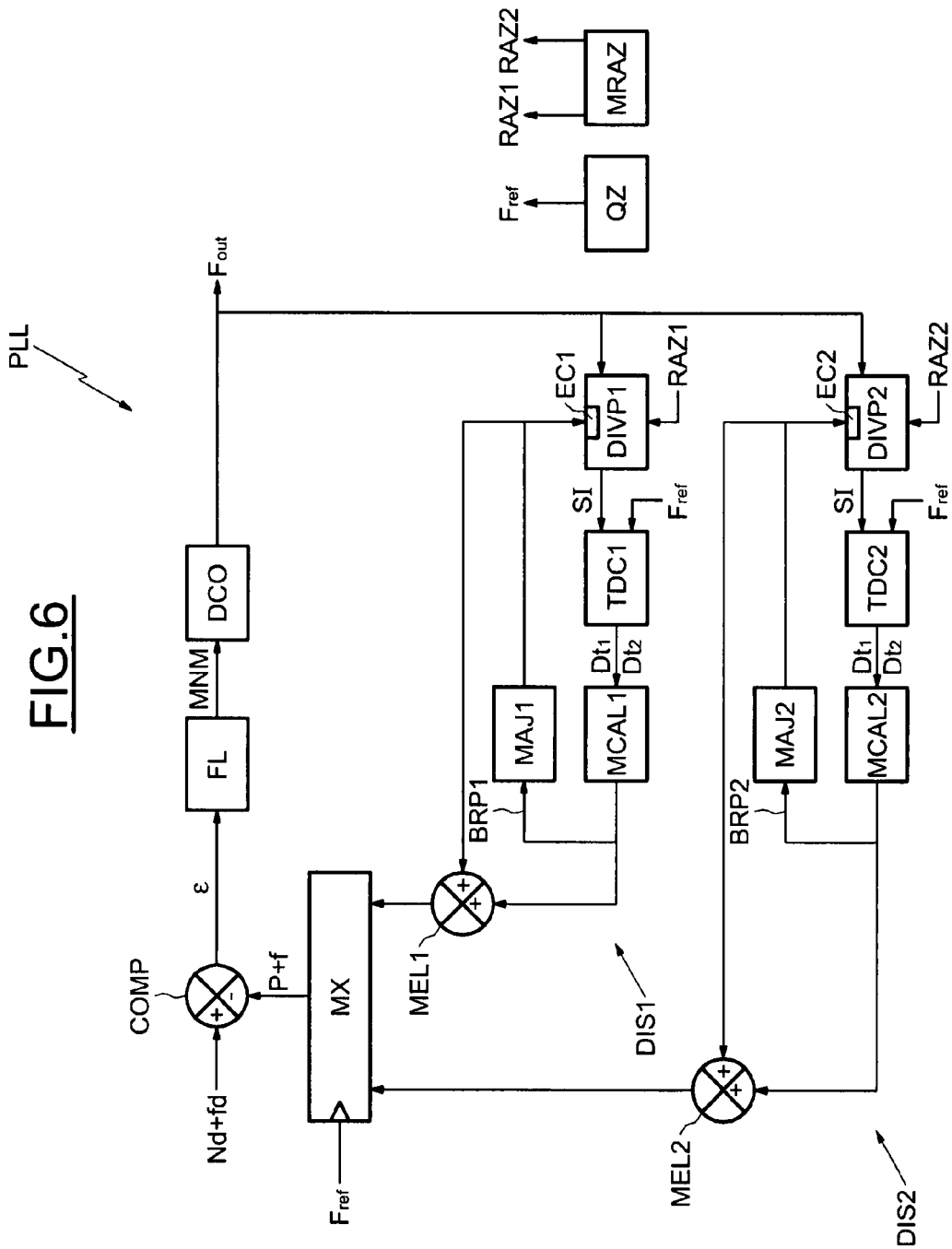
FIG. 6 shows one variant of the first embodiment of the present disclosure.

FIG. 6 generally depicts a phase-locked loop (PLL) circuit 600 having two devices, DIS1 602 and DIS2 604 in parallel, within different return loops (BRP1 and BRP2), according to one embodiment of the present disclosure. For example, the return loops (BRP1 and BRP2) are coupled to the comparator (COMP) 606 via a multiplexer (MX) 608 timed by the signal (Fref).

The signals RAZ1 and RAZ2 reset each counter/divider DIVP1 610 and DIVP2 612 to zero and are then alternated in such a manner that they are alternately activated. Thus, when one of the counters/dividers (i.e., DIVP1 610 or DIVP2 612) generates the signal (SI), the other is deactivated allowing the calculation of the difference $Dt_1-Dt_2$. Accordingly, the embodiment shown in FIG. 6 allows the processing rate of the phase-locked loop (PLL) circuit 600 to be increased.

Figure 7:
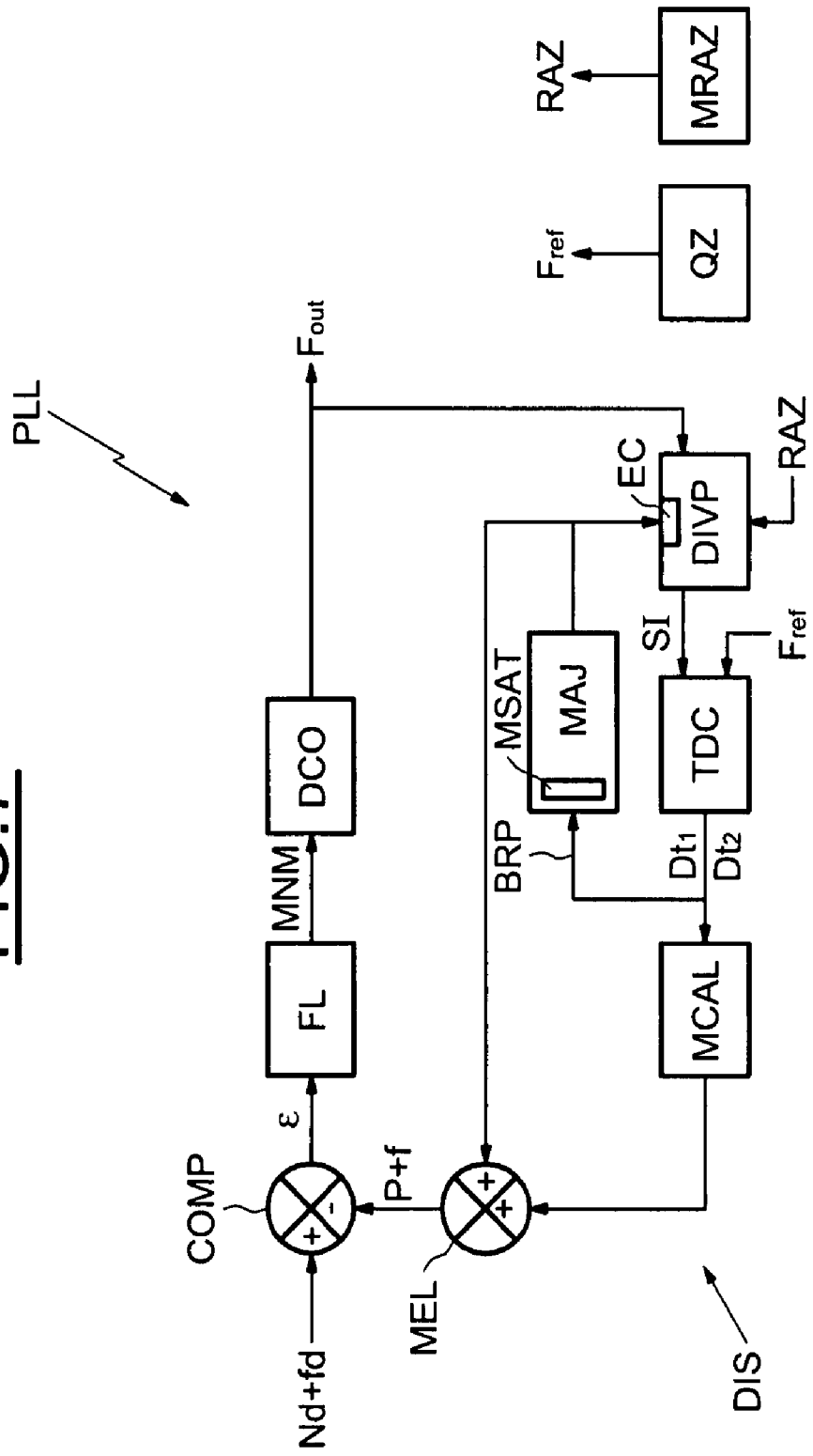
FIG. 7 shows a second embodiment according to the present disclosure.

FIG. 7 depicts a phase-locked loop (PLL) circuit 700 having device (DIS) 702 where the return loop (BRP) is connected between the output of the means (TDC) 704 and the control input of the counter/divider (DIVP) 706. The embodiment shown in FIG. 7 is particularly adapted to the case where the effective ratio between the signals Fout and Fref are close to the ratio to be determined, if the frequency range of operation of the PLL is narrow for example.

According to the embodiment shown in FIG. 7, the feedback loop (BRP) is connected between the output of the measurement means (TDC) 704 and the control input (EC) 708. The adjustment means (MAJ) 710 therefore comprise means (MSAT) 712 for detecting a saturation of the differences (or, more generally, the minimum and maximum limiting thresholds), in other words, in practice, integers $N_1$ and $N_2$ ($N_i$ in the general case).

Indeed, instead of detecting a possible saturation of the difference between $Dt_2$ and $Dt_1$, one solution is to detect this possible saturation on the integers, in other words to detect whether these integers go outside of a range of values within which they must be included. Given a state close to the locking of the PLL circuit 700, the adjustments of the value of the divider integer (P) in the case of saturation of at least one integer ($N_i$) are made by incrementation or decrementation by only one unit.

It is then possible to carry out the first phase at each period of the reference signal (Fref). In this case, the reset-to-zero signal (RAZ) is deactivated. Therefore, the embodiment shown in FIG. 7 allows the operation speed of the device (DIS) 702 to be increased. The algorithm described herein below may be implemented in the saturation means (MSAT) 712 so as to avoid a possible saturation of the integers ($N_i$). The example is presented with the integer ($N_2$) by way of example. In order not to be saturated, the value of $N_2$ must be bounded according to the relationship exemplified by Equation 7 below.

$$N\_lim\_inv < N_2 < N\_lim\_sup \quad \text{(Eqn. 7)}$$

In Equation 7, the following relationships could be true: $N\_lim\_inv > 0$ and $N\_lim\_sup < 2\, Tout/T_{inv}$. The following three tests are then simultaneously applied:

(1) If $N_2 < N\_lim\_inv$, then the value of the divider integer (P) is incremented;

(2) if $N_2 > N\_lim\_sup$, then the value of the divider integer (P) is decremented; and (3) if $N\_lim\_inv < N_2 < N\_lim\_sup$, then (a) if f>0.5, the value of N+1 is then assigned to the divider integer (P), (b) if, however, f<0.5, the value of N is then assigned to the divider integer (P).

It is particularly advantageous, in the embodiment shown in FIG. 6, to use a device (DIS) 604 such as is illustrated in FIG. 7 within one of the return loops of the PLL circuit 700. In this case, the main loop of the PLL circuit 700 comprising a device (DIS) 202 such as is illustrated in FIG. 2 is activated via the signal (RAZ1), when the phase-locked loop (PLL) circuit 700 is not locked.

The auxiliary loop of the PLL circuit 700 comprising a device (DIS) 702 such as is illustrated in FIG. 7 is activated via the signal (RAZ2), when the phase-locked loop (PLL) circuit 700 is locked. In this case, unity incrementation or decrementation of the divider integer (P) is sufficient in order to counteract any possible variations in the ratio Nd+fd.

Figure 8:
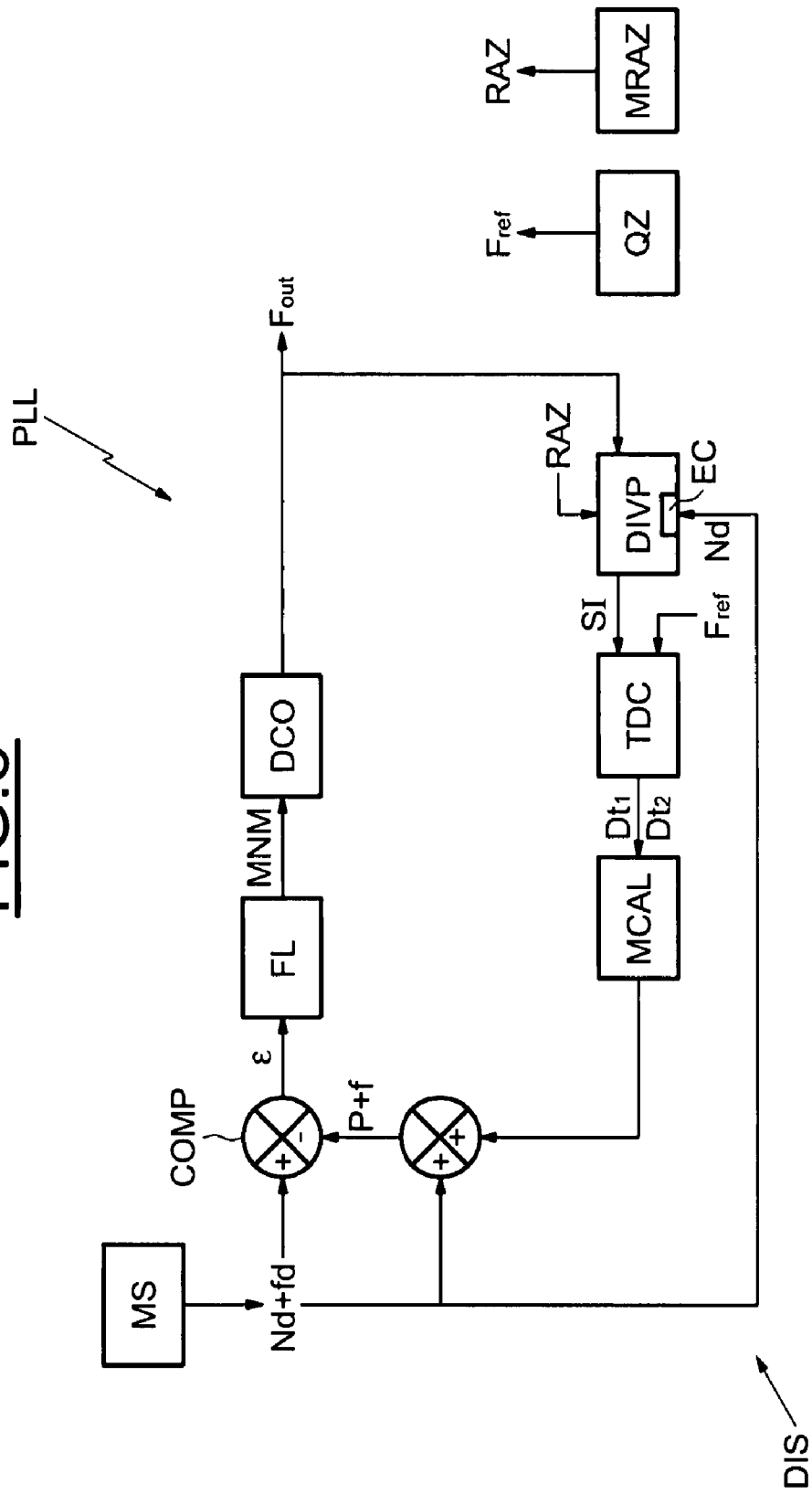
FIG. 8 shows a third embodiment according to the present disclosure.

Reference is now made to FIG. 8, which illustrates one embodiment of a phase-locked loop (PLL) circuit 800 integrating a device (DIS) 802 for generating a digital word representative of a non-integer ratio within its return loop, in the case where the value of the integer part of the ratio to be determined, Nd, is known. For example, a target ratio Rc=Nd+fd is delivered to the input of the comparator (COMP) 804. This ratio (Rc) is the ratio formed between the respective periods of a control signal and of the reference signal (Fref).

Since the integer part (Nd) is known (it is stored for example in storage means (MS) 806), it is digitally programmed into the divider/counter (DIVP) 808. For this purpose, the integer part (Nd) is directly delivered to the control input (EC) 810 of the divider/counter (DIVP) 808. Consequently, the convergence towards the ratio to be determined is much faster, given that the divider integer of the division carried out by the divider/counter (DIVP) 808 is directly Nd.

Accordingly, the device (DIS) 802 is can be simplified. Indeed, the difference between the ratio determined by the device (DIS) 802 and the target ratio (Rc) very rapidly reaches very low values. The convergence of the ratio determined by the device (DIS) 802 can therefore be achieved by the comparator (COMP) 804 alone, associated with the filter (FL) 812 and with the oscillator (DCO) 814 of the PLL circuit 800 (without the device (DIS) 802 having its own return loop).

The following figures illustrate embodiments of the various components of the return loop BR according to the present disclosure.

Figure 9:
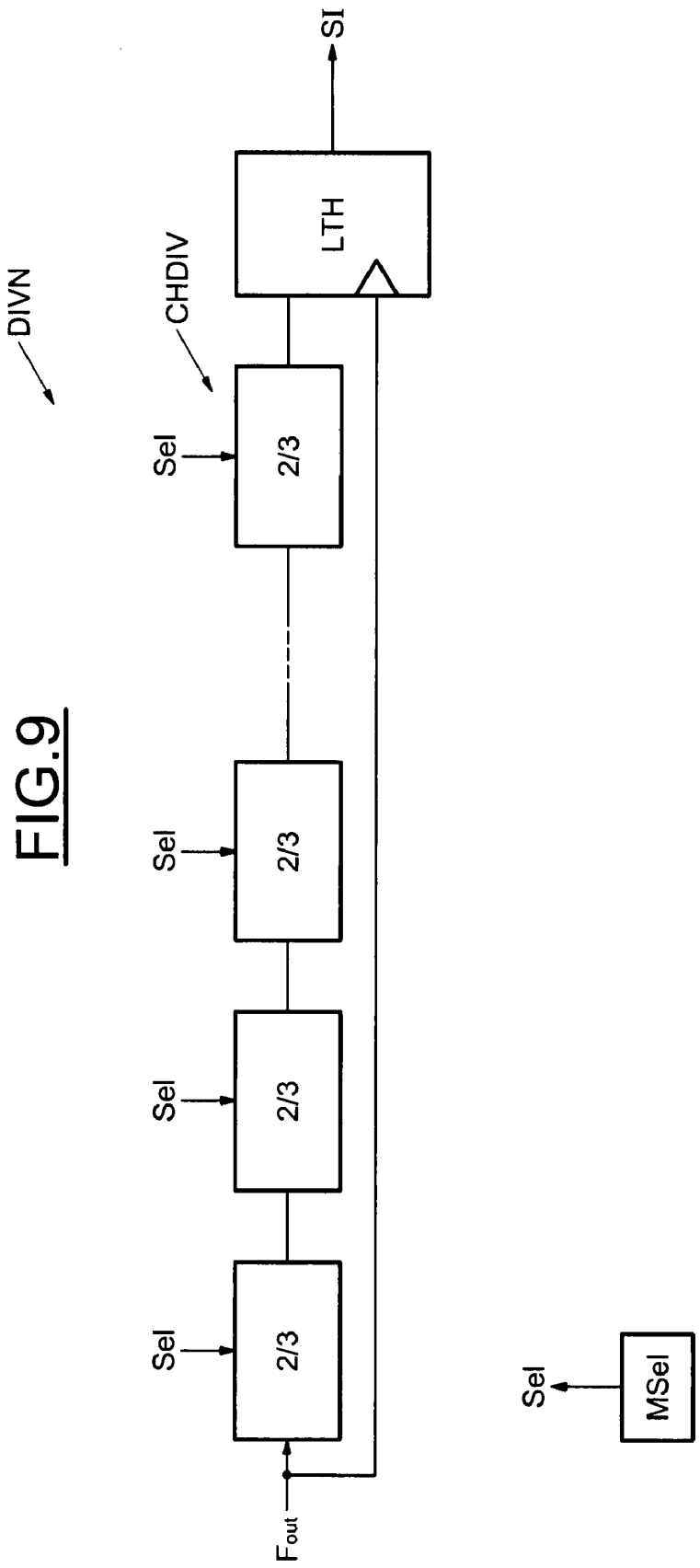
FIGS. 9 and 10 each show one embodiment of a counter/divider according to the present disclosure.

FIG. 9 illustrates a counter/divider (DIVN) 900 according to one embodiment of the present disclosure. The counter/divider (DIVN) 900 includes a chain of dividers (CHDIV) 902a, 902b, 902c and 902d, in pairs or in threes. Dividers (CHDIV) 902a, 902b, 902c and 902d are sometimes collectively referred to herein as dividers or divider chain (CHDIV) 902. Selection means (Msel) 904 delivers a selection signal (Sel), so as to select the number of dividers 902 required in order to carry out a division by N.

The first divider 902a of the divider chain (CHDIV) 902 receives the signal Fout at its input. A flip-flop (LTH) 906 could be, for example, a flip-flop D, and receives at its input the signal delivered by the last divider 902d of the chain of selected dividers (CHDIV) 902, and delivers at its output the edges of the intermediate signal every N edges of the divided signal (Fout).

This flip-flop (LTH) 906 is synchronized onto the signal, Fout, in such a manner that any possible noise difference (due to the propagation time of the gates for example) between the intermediate signal and the edges of the divided signal, Fout, is constant. Thus, this noise difference disappears when the value of the difference ($N_1-N_2$) is calculated.

Figure 10:
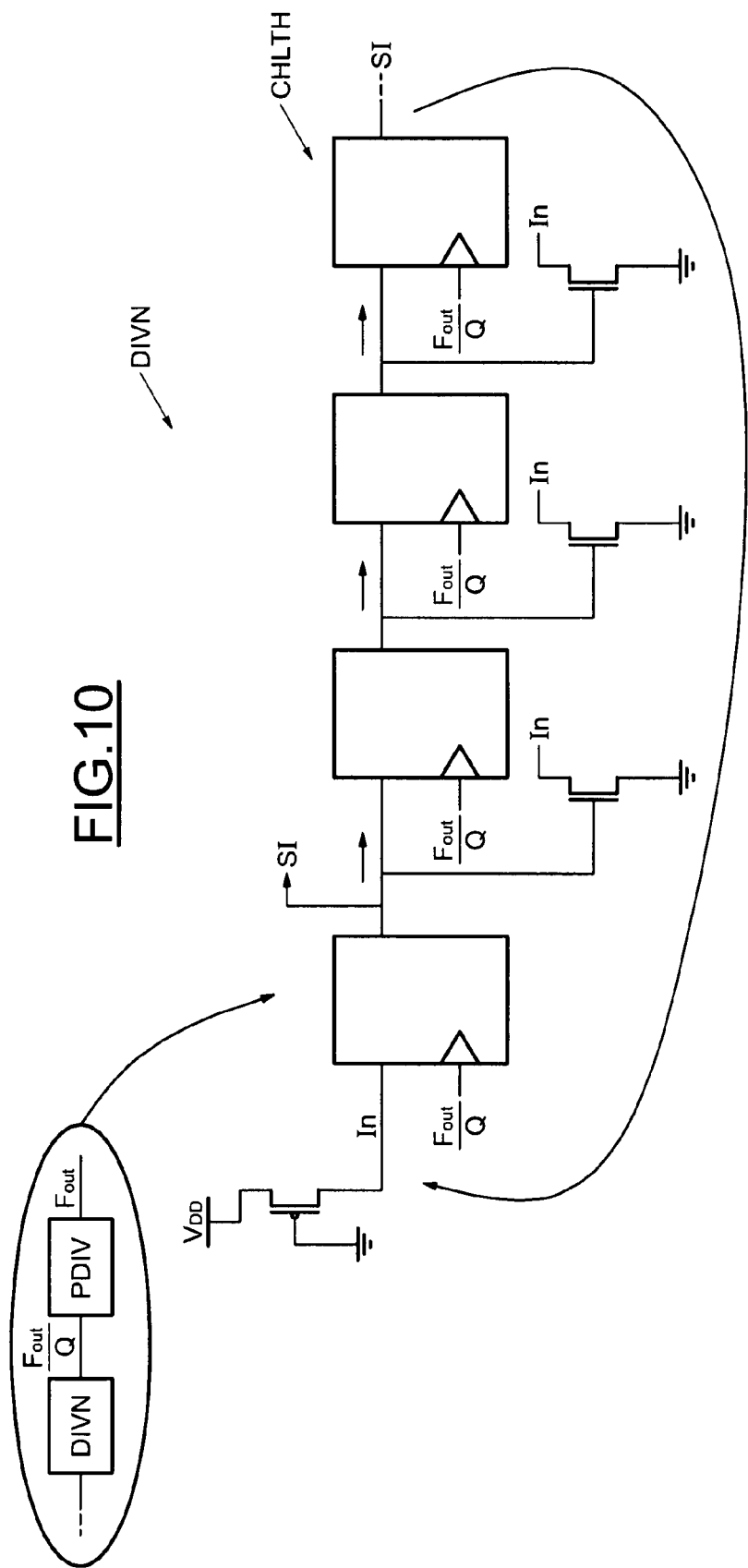

FIG. 10 illustrates another divider (DIVN) 1000 according to one embodiment of the present disclosure. Divider (DIVN) 1000 includes a pre-divider (PDIV) 1002 connected upstream of the divider (DIVN) 1004. This pre-divider (PDIV) 1002 receives the signal Fout at its input and delivers this signal Fout divided by an integer (Q) at its output. The use of a pre-divider (PDIV) 1002 is optional, but allows the number of logic gates used within the divider (DIVN) 1000 to be advantageously limited. The embodiment shown in FIG. 9 implements the division method generally referred to as "Walking Bit".

The divider (DIVN) 1000 also includes a PMOS transistor 1006, whose gate is connected to ground, source to the power supply voltage $V_{DD}$ and drain to a chain of flip-flops (CHLTH) 1008a, 1008b, 1008c and 1008d. Flip-flops (CHLTH) 1008a, 1008b, 1008c and 1008d are sometimes collectively referred to as chain of flip-flops or flip-flops 1008. Since the gate of the PMOS transistor 1006 is connected to ground, the latter transmits a bit having the value "1" to the chain of flip-flops (CHLTH) 1008, via a connection "In" 1010.

The number of activated flip-flops 1008 in the chain of flip-flops (CHLTH) 1008 corresponds to the divider (DIVN) 1000 of the division remaining to be carried out after the pre-division by Q has been done by means of the pre-divider (PDIV) 1002.

Each of the flip-flops 1008 is synchronized by the signal Fout divided by Q. The output of each flip-flop 1008 is connected to the gate of an NMOS transistor 1012a, 1012b or 1012c. NMOS transistors 1012a, 1012b or 1012c are sometimes collectively referred to herein as NMOS transistors 1012. The drain of each of NMOS transistors 1012 is connected to the output of the PMOS transistor 1006 delivering the bit, and its source is connected to ground.

The intermediate signal (SI) is sampled at the output of the first flip-flop 1008a, then the bit delivered by the PMOS transistor 1006 propagates, from flip-flop to flip-flop, within the chain of flip-flops (CHLTH) 1008. The value of the output of the PMOS transistor 1006 is set to "0" by the NMOS transistors 1012 which correspond to the flip-flops 1008 propagating the bit. When the last flip-flop 1008 selected has transmitted the bit (i.e., when the division by the adequate divider has been effected) the last NMOS transistor 1012 re-establishes the value $V_{DD}$ at the output of the PMOS transistor 1006 in order to generate a new bit to be propagated.

Figure 11:
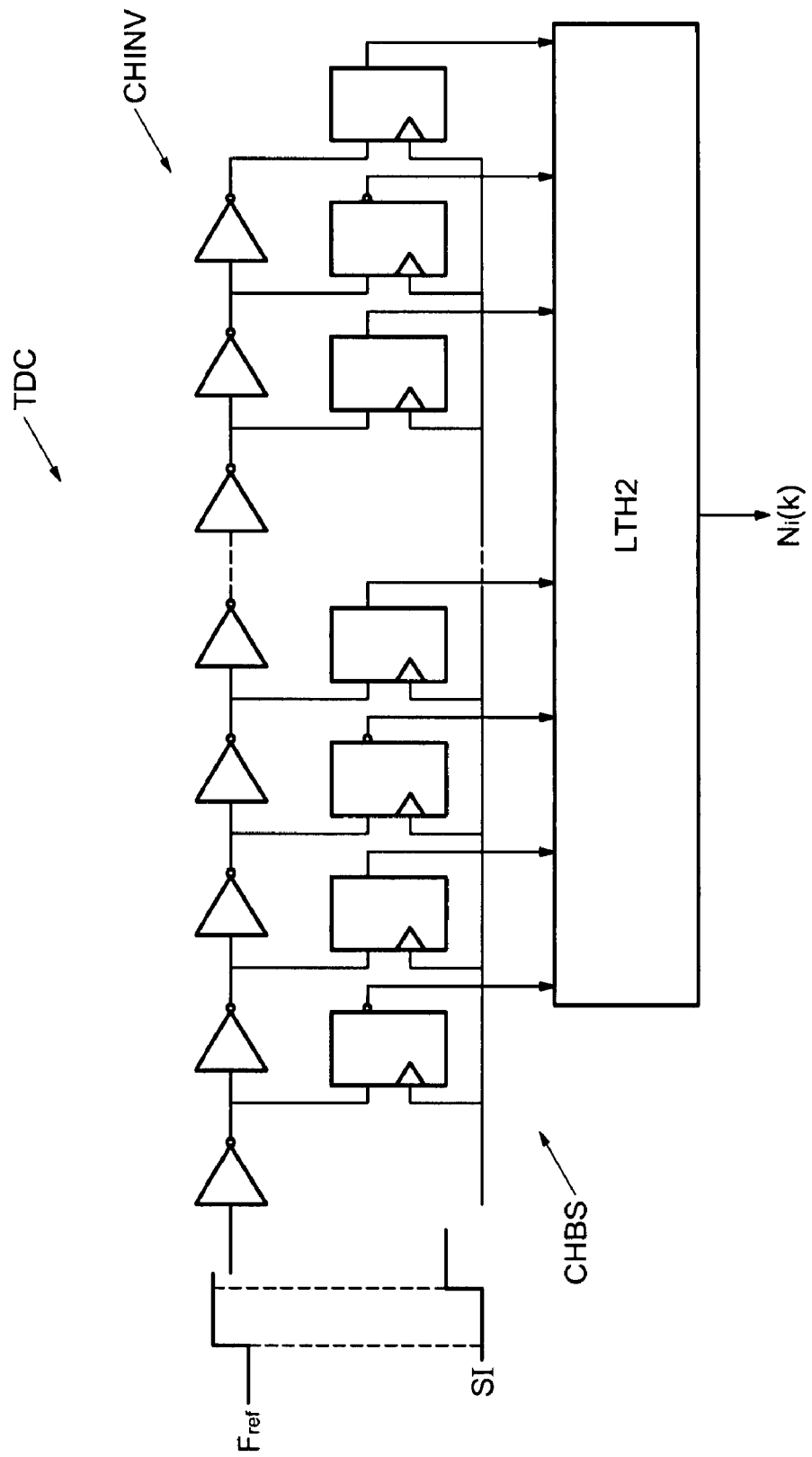
FIGS. 11, 12a, 12b, 13a and 13b illustrate in more detail certain means incorporated into the various embodiments of the present disclosure.

FIG. 11 illustrates one embodiment of the aforementioned measurement means (TDC) 210 (or, for example, measurement means (TDC) 704). In order to measure the auxiliary time differences $Dt_1$ and $Dt_2$, the integers N1 and N2 indicating the number of inverters 1102a-1102h traversed in a chain of inverters are determined. Inverters 1102a-1102f are sometimes collectively referred to herein as chain of inverters (CHINV) 1102.

The traverse time, $T_{inv}$, of the inverters 1120 allows the values of $Dt_1$ and $Dt_2$ to be obtained except for the quantization errors. For this purpose, the measurement means (TDC) 210 are formed, for example, by a time-to-digital converters well known to those skilled in the art. This converter samples the auxiliary time differences $Dt_1$ and $Dt_2$ according to the sampling step $T_{inv}$, in such a manner as to obtain the integers N1 and N2 representative of the durations of the auxiliary time differences $Dt_1$ and $Dt_2$.

The converter (TDC) 210 also includes a chain of inverters (CHINV) 1102 and a chain of flip-flops (CHBS) 1104a-1104f alternately with inverting and non-inverting outputs. Flip-flops (CHBS) 1104a-1104f are sometimes collectively referred to herein as chain of flip-flops (CHBS) 1104.

In one embodiment, the chain of flip-flops (CHBS) 1104 preferably includes as many flip-flops as the chain of inverters (CHINV) 1102 includes inverters. The propagation delay of each inverter 1102 corresponds to the sampling step $T_{inv}$.

The first inverter 1102a of the inverter chain (CHINV) 1102 receives the reference signal (Fref) at its input. Then, each inverter 1102 receives at its input the signal delivered by the inverter connected upstream. In addition, the output of each inverter 1102 is connected to the input of the corresponding flip-flop of the chain of flip-flops (CHBS) 1104. Each flip-flop 1104 is synchronized onto the intermediate signal (SI). The outputs of each flip-flop of the chain of flip-flops (CHBS) 1104 are connected to a flip-flop (LTH2) 1106.

As explained in the article "Field-Programmable-Gate-Area-Based-Time-to-Digital Converter with 200-ps Resolution", IEEE Transactions on instrumentation and measurement, Vol. 46, No. 1, February 1997, by Jozef Kalisz, or else in the article "A new DLL-Based Approach for All-Digital Multiphase Clock Generation", IEEE Journal of Solid-state circuits, Vol. 39, No. 3, March 2004, by Ching-Che Chung and Chen-Yi Lee, the flip-flop (LTH2) 1106 generates a code in such a manner as to express the differences $Dt_1$ and $Dt_2$ as a function of the traverse time of each inverter of the inverter chain (CHIHV) 1102.

Figure 12A:
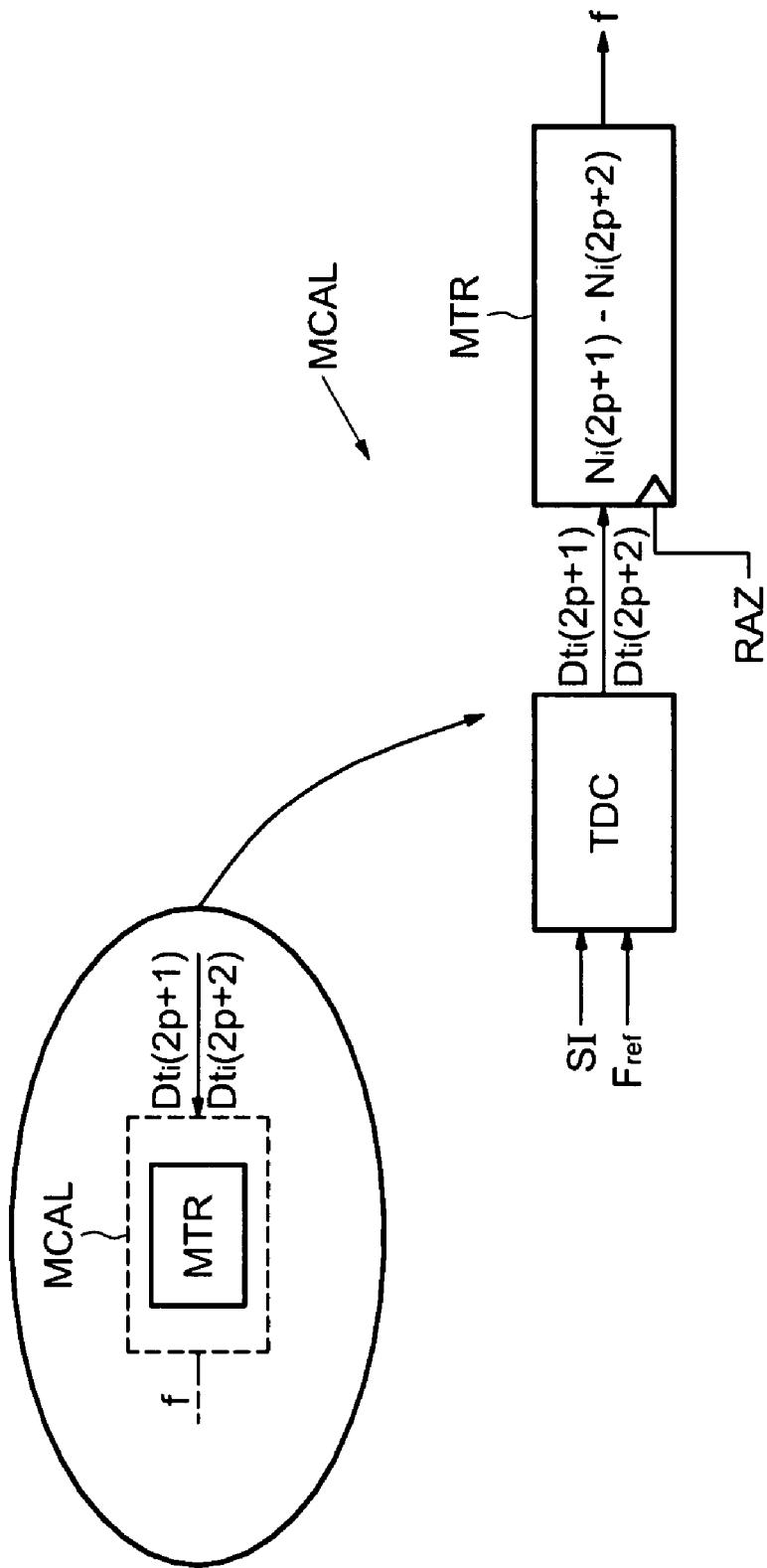

FIG. 12A illustrates one embodiment 1220a of the digital processing means (MTR) 1202 incorporated within the calculation means (MCAL) 212 according to the present disclosure. Digital processing means (MTR) 1202 effect the processing over several periods of the reference signal, Fref.

Figure 12B:
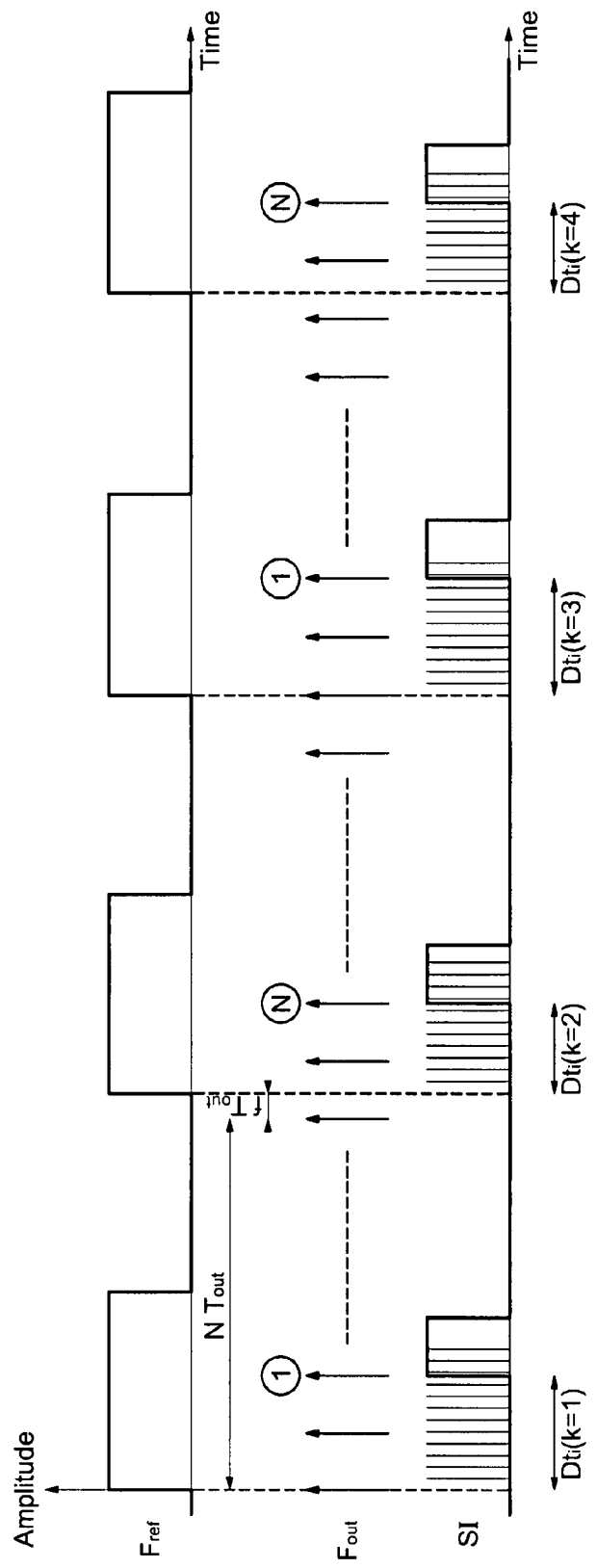

FIG. 12B shows plot 1200b where the index (k) corresponds to the period of the reference signal being taken into account. The method of digital processing implemented by the digital processing means (MTR) 1202 here includes calculating the difference between two successive integers $N_i$ (2p+1) and $N_i$ (2p+2), that are functions of two successive differences $Dt_i$ (2p+1) and $Dt_i$ (2p+2), p being an integer, and i corresponding to 1 or 2, according to the rank 2p+1 or 2p+2, as seen in FIG. 12b. For this purpose, the processing means (MTR) 1202 is synchronized, in this example, onto the reset-to-zero signal (RAZ).

Thus, when the reset-to-zero signal (RAZ) goes to zero (as in this example), the processing means (MTR) 1202 calculates the difference between two successive integers $N_i$ (2p+1) and $N_i$ (2p+2) according to the relationship exemplified by Equation 8 below.

$$N_i(2p+1)-N_i(2p+2) \qquad \text{(Eqn. 8)}$$

Accordingly, in one embodiment, the present disclosure provides a method of digital processing that is low-cost, direct and fast. The method provides a short calculation time and is conducive to a small surface area of silicon for its fabrication.

Figure 13A:
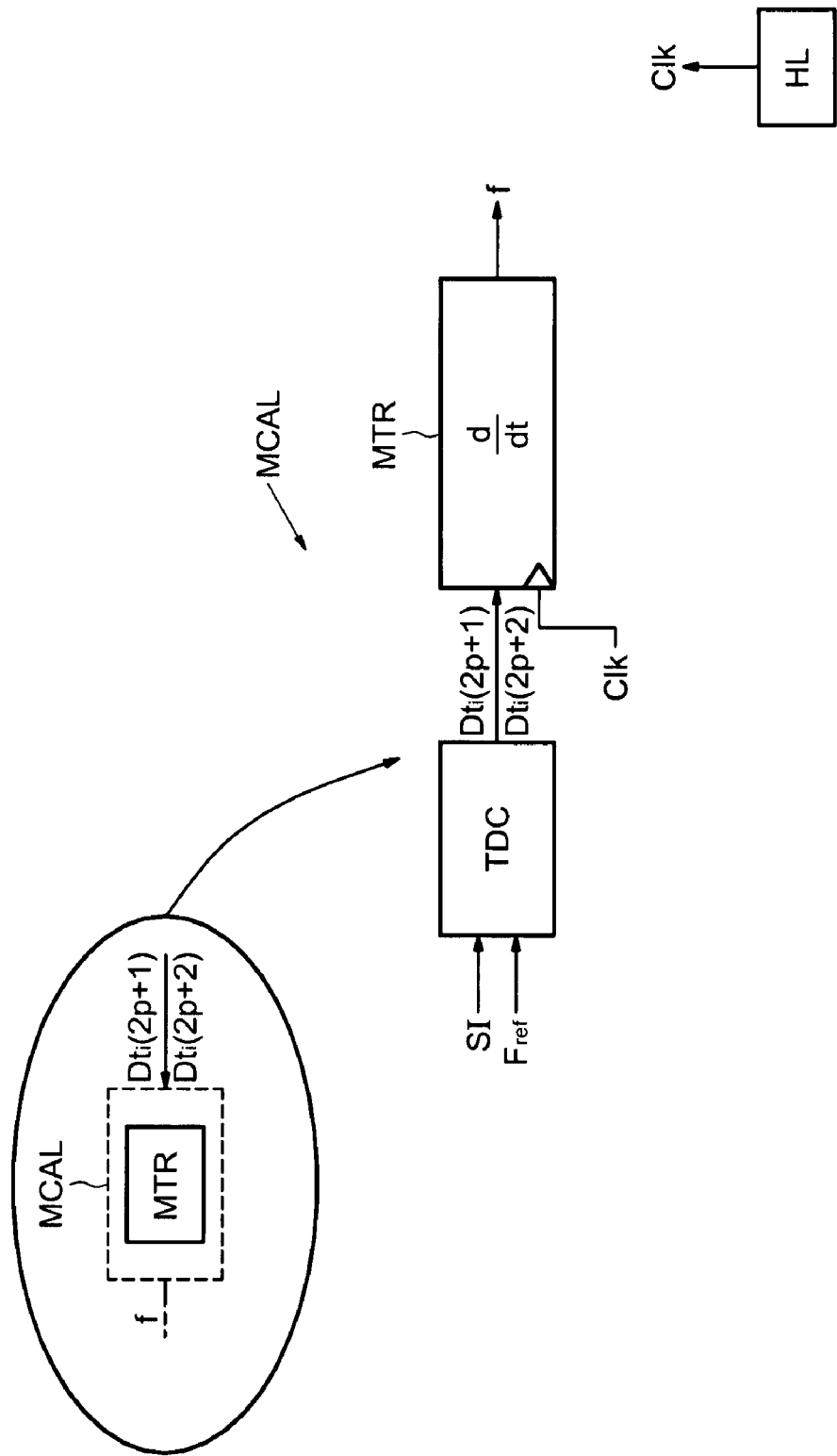
Figure 13B:
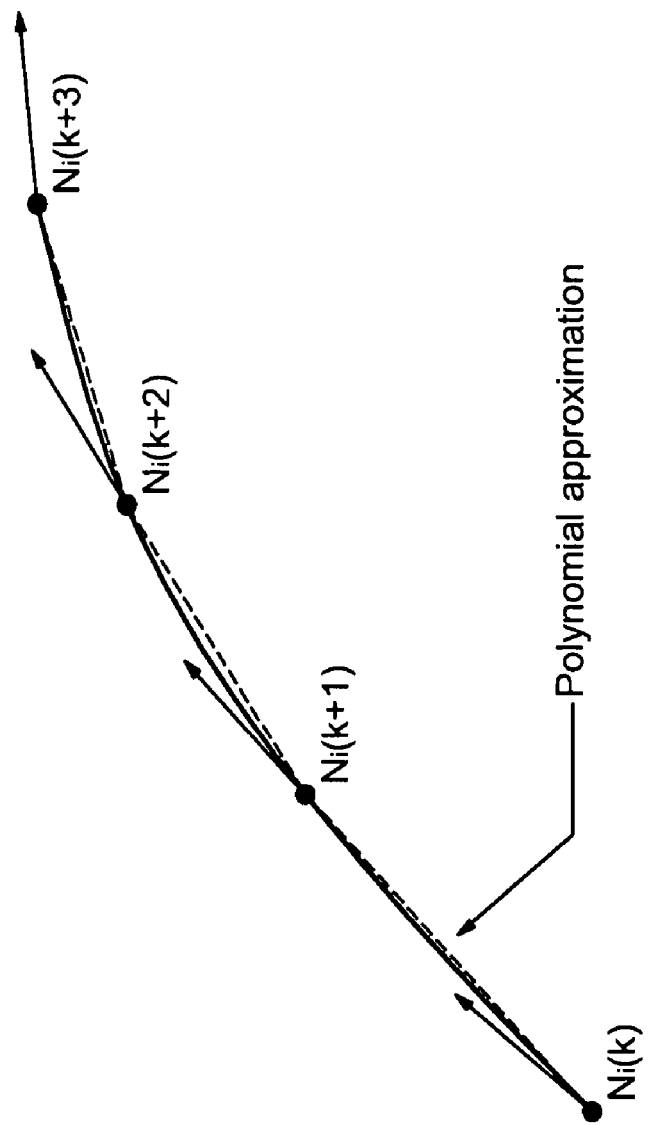

FIGS. 13A and 13B illustrate other embodiments 1300a and 1300b of the processing means (MTR) 1202 according to the present disclosure. In this example, the digital processing means (MTR) 1202 is synchronized onto a clock signal (CLK), generated for example by a clock (HL) 1302, and perform a differentiation according to, for example, a polynomial approximation method.

As shown in FIG. 13B, the method implemented by the processing means (MTR) 1202 includes calculating the difference between the integers $N_1$ and $N_2$ by performing a polynomial approximation over several successive periods of the reference signal. Although it is relatively more complex, the method illustrated by FIG. 13B provides a particularly precise result.

The present disclosure is advantageously used for, but is not limited to, applications associated with phase-locked loops (PLL), in particular phase-locked loops of the digital type using, in their main loop, a digitally-controlled oscillator (DCO) such as DCO 814. The phase-locked loop can be used in order to feedback control the frequency ratio formed between a control signal and a reference signal, in other words a signal preferably having a frequency that is stable over a given period of time (for example, a few iterations of the PLL), and the frequency ratio between a slave signal and this same reference signal.

For this purpose, the digital phase-locked loop comprises a comparator connected to the oscillator (DCO) via a filter. More precisely, the comparator transmits a digital word to a control terminal of the oscillator (DCO), which itself delivers an analogue output signal (slave signal), whose frequency is adjusted by means of the value of the digital word received at the control terminal of the oscillator (DCO). This output signal is sent through a feedback loop (or return loop) into the input of the comparator.

At another input, the comparator receives another digital word that is representative of a non-integer ratio between a control signal and the reference signal. For example, the reference signal may be generated by a quartz-crystal oscillator. The comparator compares the two digital words received at its inputs and delivers a digital value representative of the error existing between the latter, in other words the error between the two non-integer ratios. It is the digital word representative of this error that allows the value of the frequency of the output signal of the oscillator DCO to be adjusted.

More generally, the present disclosure relates to any system comprising the measurement of a frequency ratio between two analogue signals, one signal of which preferably has a frequency which is stable over a given period of time, notably in the case of an application within a PLL.

One goal of the present disclosure is to provide a solution that is particularly simple to implement and low-cost for determining a non-integer ratio between two signals, one signal of which has a chosen fixed frequency.

Another goal of the present disclosure is to obtain a result that may be easily exploited, and consequently readily compatible with other methods of digital processing for example.

In this respect, according to one embodiment, the present disclosure provides a method for generating a digital word representative of the non-integer ratio between the period of a first signal and the period of a second signal.

According to a general feature of the present disclosure, the method comprises a determination of the integer part of the ratio, then a calculation of the fractional part of the ratio, and a generation of the digital word using the determined integer part and the calculated fractional part. In other words, in contrast to the existing solutions, which seek to determine the non-integer ratio directly, the present disclosure provides firstly for the determination, in a very simple manner, of the integer part of the non-integer ratio then, once this integer part has been determined, for the calculation of the fractional part of the ratio, before generating the non-integer ratio.

It is then very easy to afterwards apply additional digital processing operations to the fractional part (in order to eliminate any possible signal noise) since the latter can be directly extracted. Furthermore, this method is particularly simple to implement since it can be carried out entirely digitally. Thus, the present disclosure may be adapted to digital technologies, in particular in regard to the latest methods for signal modulation; this is particularly advantageous given that the systems implementing digital processes are particularly robust against temperature variations and involve a low consumption in terms of power.

According to one embodiment, in which the determination of the integer part can comprise a) a time division by a divider integer P of the second signal so as to generate a divided signal, b) a generation of an intermediate signal starting from the divided signal, c) a determination of the time difference between the intermediate signal and the first signal, d) an analysis of the value of this time difference with reference to a range of values, e) a repetition, where necessary, of the steps a) to d) by successively varying the value of the divider integer P until a time difference situated within the range of values is obtained, the integer part then being the value N of the divider integer for which the time difference is situated within the range of values, this time difference being representative of the fractional part, and the calculation of the fractional part comprises the calculation of the time difference when the latter is included within the range of values.

In this case, the time division preferably comprises the counting, after a reference edge of the first signal, of P edges of the second signal starting from the $i_{th}$ edge of the second signal emitted after the reference edge, i being greater than or equal to two, in which the generation of the intermediate signal comprises a generation of a first edge simultaneously with the first edge counted of the second signal, then of a second simultaneously with the $P^{th}$ counted edge of the second signal, the determination of the time difference preferably includes: (1) a measurement of a first auxiliary time difference between the first edge of the intermediate signal and the reference edge, and of a second auxiliary time difference between the second edge of the intermediate signal and another edge of the first signal shifted by one period from this first signal with respect to the reference edge; (2) a sampling of the first and second auxiliary time differences; and (3) a calculation of the difference between the second auxiliary time difference and the first auxiliary time difference, the difference corresponding to the time difference. The processing for the calculation of the fractional part can then comprise a digital processing of the time difference, in such a manner as to obtain the fractional part.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of generating a digital word representative of the non-integer ratio between a period of a first signal (Fref) and a period of a second signal (Fout), the method comprising:
   determining an integer part of the ratio by a determination circuit;
   calculating a fractional part of the ratio by a calculation circuit; and
   generating the digital word using the determined integer part by a generation circuit and the calculated fractional part,
   wherein the step of determining the integer part comprises:
      generating a divided signal by using a time division with a divider integer of the second signal;
      generating an intermediate signal from the divided signal;
      determining the time difference between the intermediate signal and the first signal; and
      analyzing the value of the time difference with reference to a range of values.

2. The method according to claim 1 further comprising:
   successively varying the value of the divider integer until the time difference is within the range of values,
   wherein the integer part is the value of the divider integer corresponding to the time difference within the range of values, and
   wherein the fractional part is the time difference within the range of values.

3. The method according to claim 1, wherein the time division comprises:
   counting, after a reference edge of the first signal, the P edges of the second signal starting from the ith edge of the second signal emitted after the reference edge, wherein i is greater than or equal to two.

4. The method according to claim 1, wherein the step of generating the intermediate signal further comprises generating a first edge simultaneously with the first edge counted of the second signal, and generating a second edge simultaneously with the Pth counted edge of the second signal, and
   wherein the step of determining the time difference comprises:
      measuring a first auxiliary time difference (Dt1) between the first edge of the intermediate signal and the reference edge, and measuring a second auxiliary time difference (Dt2) between the second edge of the intermediate signal and another edge of the first signal shifted by one period from this first signal with respect to the reference edge,
      sampling the first and the second auxiliary time differences, and
      calculating the difference between the second auxiliary time difference (Dt2) and the first auxiliary time difference (Dt1), the difference corresponding to the time difference,
   wherein the step of calculating the fractional part comprises a digital processing of the time difference.

5. The method according to claim 1, wherein the step of determining the integer part further comprises:
   time dividing the second signal by a divider integer to generate a divided signal, the division comprising counting, after a reference edge of the first signal, P edges of the second signal starting from the ith edge of the second signal emitted after the reference edge, wherein i is greater than or equal to two;
   generating an intermediate signal (SI) from the divided signal;
   generating a first edge simultaneously with the first edge counted of the second signal;
   generating a second edge simultaneously with the Pth counted edge of the second signal;
   measuring a first auxiliary time difference (Dt1) between the first edge of the intermediate signal and a reference edge of the first signal;
   measuring a second auxiliary time difference (Dt2) between the second edge of the intermediate signal and another edge of the first signal shifted by one period from this first signal with respect to the reference edge; and
   sampling and analyzing the value of each auxiliary time difference sampled.

6. The method according to claim 5 further comprising:
   successively varying the value of the divider integer until each auxiliary time difference sampled is within a corresponding range of values,
   wherein the value of the divider integer is representative of the integer part and the difference between the second and the first time difference is representative of the fractional part, and
   wherein the step of calculating the fractional part comprises digitally processing the first and second auxiliary time differences sampled, and calculating the difference between the first and second auxiliary time differences sampled, wherein the difference corresponds to a value representative of the fractional part.

7. The method according to claim 5 further comprising repeating the step of determining the integer part,
   wherein the step of generating the digital word comprises:
      a first phase that comprises the step of determining the integer part; and
      a second phase that comprises the step of digitally processing the calculation of the fractional part following a first phase,
   wherein at each repetition of the step of determining the integer part of the first phase, the second phase is carried out successively to this first phase.

8. The method according to claim 5, further comprising repeating the step of determining the integer part at least once,
   wherein the step of generating the digital word comprises:
      a first phase that comprises the step of determining the integer part; and
      a second phase that comprises the step of digitally processing the calculation of the fractional part following a first phase, and
   wherein the second phase corresponding to a given application of a first phase is carried out simultaneously with the repetition of the step of determining the integer part.

9. The method according to claim 5 further comprising:
   generating an additional signal (RAZ) taking a first value during the first phase; and
   generating a second value of the additional signal (RAZ) during the second phase.

10. The method according to claim 1, wherein the step of determining the integer part comprises:
    fixing the value of the integer part at a predetermined number N;
    time dividing the second signal by N to generate a divided signal; and
    generating an intermediate signal (SI) from the divided signal,
    wherein the step of calculating the fractional part comprises determining the time difference between the intermediate signal and the first signal, and wherein the time difference is representative of the fractional part.

11. The method according to claim 10, wherein the step of time dividing comprises:
- counting, after a reference edge of the first signal, N edges of the second signal starting from the ith edge of the second signal emitted after the reference edge, wherein i is greater than or equal to two,
- wherein the step of generating the intermediate signal comprises generating a first edge simultaneously with the first edge counted of the second signal, and generating a second edge simultaneously with the Nth counted edge of the second signal,
- wherein the time difference comprises:
  - a measurement of a first auxiliary time difference (Dt1) between the first edge of the intermediate signal and the reference edge, and of a second auxiliary time difference (Dt2) between the second edge of the intermediate signal and another edge of the first signal shifted by one period from this first signal with respect to the reference edge,
  - a sampling of the first and second auxiliary time differences,
  - a calculation of the difference between the second auxiliary time difference (Dt2) and the first auxiliary time difference (Dt1), the difference corresponding to the time difference, and
- wherein the step of calculating the fractional part comprises digitally processing the time difference to obtain the fractional part.

12. A device for generating a digital word representative of the non-integer ratio between the period of a first signal and the period of a second signal, the device comprising:
- a determination circuit configured to determine the integer part of the ratio;
- a calculation circuit configured to calculate the fractional part of the ratio, wherein the calculation circuit is coupled with an output of the determination circuit; and
- a generation circuit configured to generate the digital word from the determined integer part and from the calculated fractional part,
- wherein the determination circuit comprises:
  - a counter/divider having a divider integer, the counter/divider activated by a third signal, and configured to receive the second signal at its input, generate a divided signal, and generate an intermediate signal from the divided signal, wherein the counter/divider comprises a control input configured to modify the value of the divider integer;
  - a measurement circuit configured to measure auxiliary differences between the intermediate signal and the first signal, by sampling them, the calculation circuit being further configured to determine a time difference representative of the fractional part from the sampled auxiliary differences and analyze the value of this time difference with reference to a range of values; and
  - a return loop, between the output of the calculation circuit and the control input of the counter/divider, the return loop comprising an adjustment circuit configured to adjust the value of the divider integer until the time difference is included within the range of values.

13. The device according to claim 12, wherein the determination circuit comprises:
- a counter/divider having a divider integer, the counter/divider activated by an additional signal and configured to receive the second signal at its input and of generate a divided signal then an intermediate signal from the divided signal, the counter/divider comprising a control input configured to modify the value of the divider integer;
- a measurement circuit configured to measure auxiliary differences between the intermediate signal and the first signal by sampling them; and
- a return loop, between the output of the measurement circuit and the control input of the counter/divider, comprising an adjustment circuit configured to adjust the value of the divider integer until each sampled auxiliary time difference is included within a corresponding range of values,
- wherein the calculation circuit is configured to determine a time difference representative of the fractional part from the sampled auxiliary differences.

14. The device according to claim 12, wherein the determination circuit comprises a storage circuit configured to store a value of this integer part fixed at a predetermined number N, and deliver the value of N to a counter/divider by N that receives the second signal at its input and generates a divided signal then an intermediate signal from the divided signal, and
- wherein the calculation circuit is configured to determine the time difference between the intermediate signal and the first signal, this time difference being representative of the fractional part.

15. The device according to claim 14 further comprising:
- a measurement circuit configured to measure the sampling auxiliary time differences between the intermediate signal and the first signal,
- wherein the calculation circuit is configured to determine a time difference representative of the fractional part from the auxiliary differences and analyze the value of this time difference with reference to a range of values.

16. The device according to the claim 15, wherein the calculation circuit is configured to determine the time difference by calculating the difference between the auxiliary differences.

17. The device according to claim 16, wherein the calculation circuit is configured to determine the fractional part by software.

18. A phase-locked loop circuit for generating a digital word representative of the non-integer ratio between the period of a first signal and the period of a second signal comprising:
- a comparator configured to receive at its input a target digital word representative of a target non-integer ratio between a main signal and a reference signal having a reference frequency;
- a digitally-controlled oscillator coupled to the comparator and configured to deliver an output signal;
- at least one return loop coupled between the output of the oscillator and the comparator, wherein the return loop comprises a device configured to generate a digital word representative of the non-integer ratio between the period of the reference signal and the period of the output signal, the reference signal and the output signal respectively corresponding to the first and second signal, and the fixed integer part N being equal to the integer part of the target non-integer ratio;
- wherein the comparator is configured to compare the digital word and target digital word, and the oscillator is configured to adjust the frequency of the output signal as a function of the result delivered by the comparator, and
- wherein the circuit comprises a control circuit configured to control the operation of the phase-locked loop at least as long as the fractional part of the non-integer ratio does not belong to a range of values.

19. The phase-locked loop circuit according to claim 18, wherein the device comprises:
- a determination circuit configured to determine the integer part of the ratio;
- a calculation circuit configured to calculate the fractional part of the ratio, wherein the calculation circuit is coupled with an output of the determination circuit; and
- a generation circuit configured to generate the digital word from the determined integer part and from the calculated fractional part.

20. The phase-locked loop circuit according to claim 19, wherein the determination circuit comprises:
- a counter/divider having a divider integer, the counter/divider activated by a third signal, and configured to receive the second signal at its input, generate a divided signal, and generate an intermediate signal from the divided signal, wherein the counter/divider comprises a control input configured to modify the value of the divider integer;
- a measurement circuit configured to measure auxiliary differences between the intermediate signal and the first signal, by sampling them, the calculation circuit being further configured to determine a time difference representative of the fractional part from the sampled auxiliary differences and analyze the value of this time difference with reference to a range of values; and
- a return loop, between the output of the calculation circuit and the control input of the counter/divider, the return loop comprising an adjustment circuit configured to adjust the value of the divider integer until the time difference is included within the range of values.

* * * * *